US012683133B2

(12) United States Patent　(10) Patent No.: US 12,683,133 B2
Mun　(45) Date of Patent:　Jul. 14, 2026

(54) PLASMA PROCESSING APPARATUS AND METHOD OF MANUFACTURING SEMICONDUCTOR DEVICE

(71) Applicant: SAMSUNG ELECTRONICS CO., LTD., Suwon-si (KR)

(72) Inventor: Jeongil Mun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 483 days.

(21) Appl. No.: 18/208,530

(22) Filed: Jun. 12, 2023

(65) Prior Publication Data

US 2024/0412958 A1　Dec. 12, 2024

(51) Int. Cl.
H01J 37/32　(2006.01)
H10P 50/24　(2026.01)

(52) U.S. Cl.
CPC .. H01J 37/32862 (2013.01); H01J 37/32642 (2013.01); H10P 50/242 (2026.01); *H01J 2237/201* (2013.01); *H01J 2237/20235* (2013.01); *H01J 2237/334* (2013.01)

(58) Field of Classification Search
None
See application file for complete search history.

(56) References Cited

U.S. PATENT DOCUMENTS 6,566,270 B1　5/2003　Liu et al.
6,880,264 B2　4/2005　Kato et al.

10,008,366　B2　6/2018　Kang et al.
10,240,230　B2　3/2019　Odedra
10,265,742　B2　4/2019　Cho et al.
11,804,368　B2　10/2023　Koshimizu
2004/0180553　A1　9/2004　Park et al.
2012/0237693　A1　9/2012　Jackson et al.
2014/0083453　A1　3/2014　Yin et al.
2017/0069463　A1　3/2017　Kang et al.
2019/0093218　A1　3/2019　Lay et al.
2019/0360092　A1　11/2019　Sato et al.

(Continued)

FOREIGN PATENT DOCUMENTS

KR　10-1992-0005275　A　3/1992
KR　10-2001-0056698　A　7/2001
KR　10-2003-0031190　A　4/2003

(Continued)

OTHER PUBLICATIONS

Communication dated Apr. 27, 2025, issued by the Korean Patent Office in Korean Application No. 10- 2022-0014186.

(Continued)

*Primary Examiner* — Duy Vu N Deo
*Assistant Examiner* — Andrew Keelan Laobak
(74) *Attorney, Agent, or Firm* — Sughrue Mion, PLLC

(57) ABSTRACT

Provided is a method of manufacturing a semiconductor device. The method comprises loading a substrate having a first diameter onto a substrate support within a plasma chamber, performing a plasma process on the substrate, unloading the substrate from the plasma chamber, loading a dummy substrate having a second diameter smaller than the first diameter onto the substrate support, and performing a plasma cleaning process on the dummy substrate to remove foreign substance in the plasma chamber.

18 Claims, 6 Drawing Sheets

(56)                   References Cited

U.S. PATENT DOCUMENTS

| | | | |
|---|---|---|---|
| 2020/0406315 A1 | 12/2020 | Coppa et al. | |
| 2021/0280396 A1* | 9/2021 | Matsuura ................ | C23C 16/50 |

FOREIGN PATENT DOCUMENTS

| | | | | | |
|---|---|---|---|---|---|
| KR | 10-2004-0080755 A | | 9/2004 | | |
| KR | 10-2007-0045384 A | | 5/2007 | | |
| KR | 20070045384 A | * | 5/2007 | ....... | H01L 21/68742 |
| KR | 10-1792165 B1 | | 10/2017 | | |
| KR | 10-2020-0043706 A | | 4/2020 | | |
| KR | 10-2021-0111162 A | | 9/2021 | | |
| KR | 20210111162 A | * | 9/2021 | ........ | H01J 37/32862 |
| KR | 20230049178 A | * | 4/2023 | .............. | B23Q 3/15 |

OTHER PUBLICATIONS

Office Action issued Aug. 20, 2024 by the Korean Patent Office for KR Patent Application No. 10-2022-0014186.

\* cited by examiner

F I G. 3
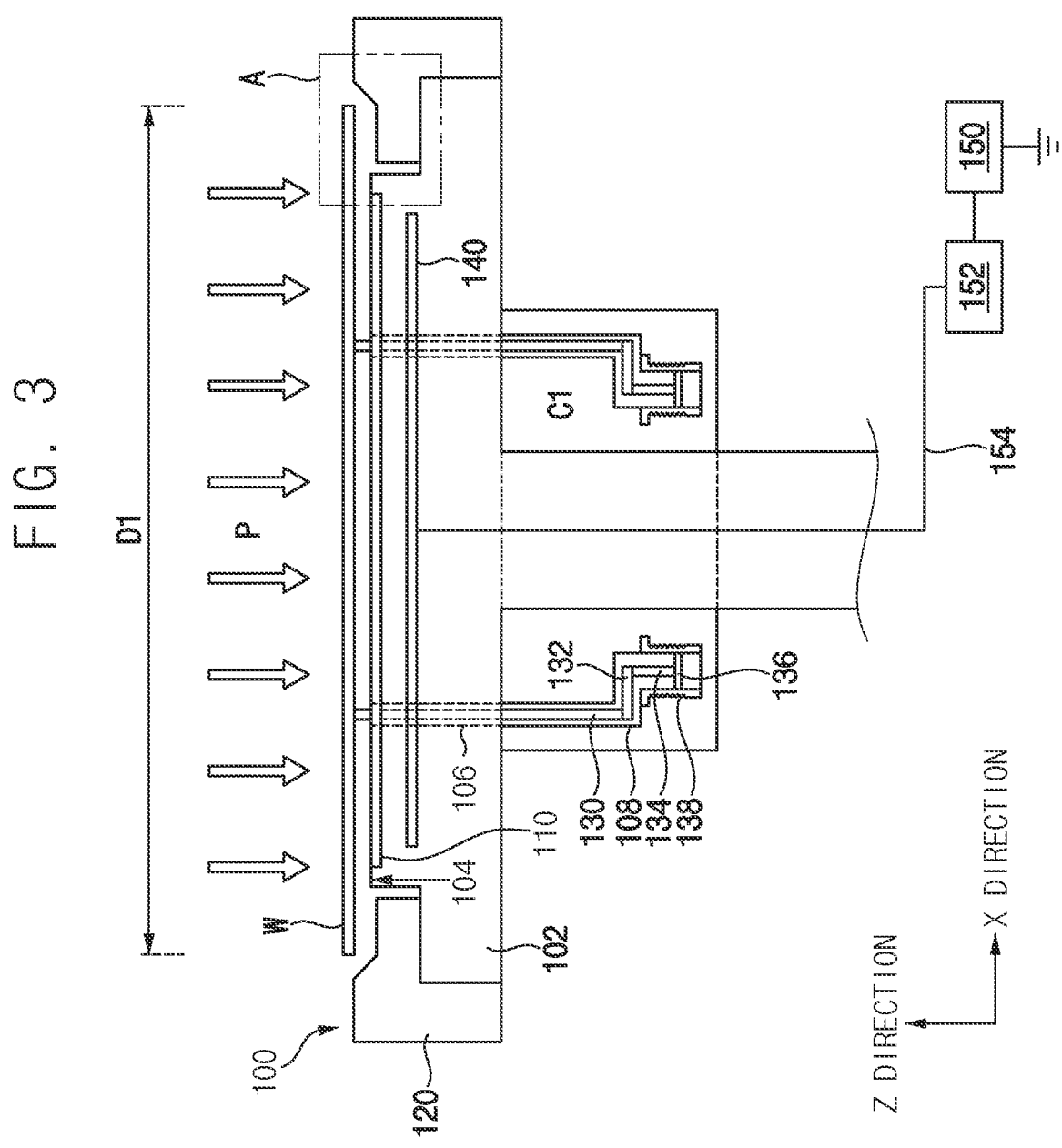

F I G. 5
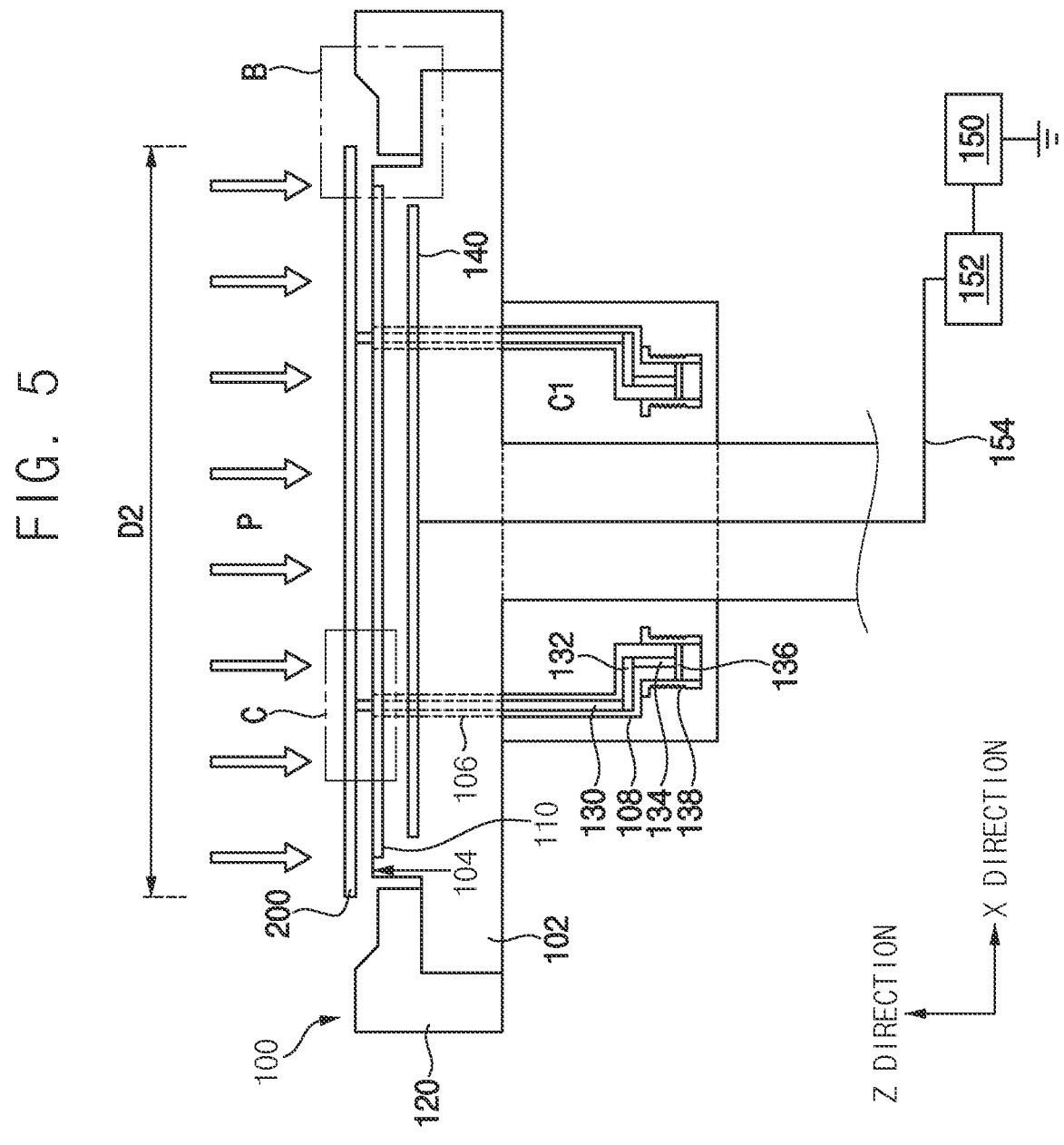

PLASMA PROCESSING APPARATUS AND METHOD OF MANUFACTURING SEMICONDUCTOR DEVICE

BACKGROUND

1. Field

The disclosure relates to a plasma processing apparatus and a method of manufacturing a semiconductor device using the same. More specifically, the disclosure relates to a plasma processing apparatus for performing a plasma etching process and a method of manufacturing a semiconductor device using the same.

2. Description of Related Art

An in-situ dry cleaning (ISD) process performed after a plasma etching process may be an essential process for maintaining homeostasis of semiconductor etching equipment. As the plasma etching process is repeatedly performed, foreign substance (polymer) may accumulate in a chamber. Since an amount of ions reaching a portion of a substrate stage supporting a semiconductor wafer is small, residual amounts of the foreign substance may be high. When the foreign substance on the substrate stage is not sufficiently removed after performing the in-situ dry cleaning process, arcing phenomenon may occur.

SUMMARY

Provided is a method of manufacturing a semiconductor device that may efficiently remove foreign substance in a plasma chamber, and a plasma processing apparatus for performing the method of manufacturing the semiconductor device.

According to an aspect of the disclosure, a method of manufacturing a semiconductor device includes: loading a substrate having a first diameter on a substrate support in a plasma chamber: performing a plasma process on the substrate: unloading the substrate from the plasma chamber: loading a dummy substrate having a second diameter smaller than the first diameter on the substrate support; and performing a plasma cleaning process on the dummy substrate to remove foreign substance in the plasma chamber.

According to an aspect of the disclosure, a method of manufacturing a semiconductor device includes: loading a substrate having a first diameter on a substrate support in a plasma chamber: performing a plasma dry etching process on the substrate; unloading the substrate from the plasma chamber: loading a dummy substrate having a second diameter smaller than the first diameter on the substrate support using a plurality of lift pins; and performing a plasma dry cleaning process on the dummy substrate to remove foreign substance in the plasma chamber.

According to an aspect of the disclosure, a method of manufacturing a semiconductor device includes: loading a substrate having a first diameter on a substrate support in a plasma chamber: performing a plasma dry etching process on the substrate; unloading the substrate from the plasma chamber: loading a dummy substrate having a second diameter smaller than the first diameter on the substrate support; and performing a plasma dry cleaning process on the dummy substrate to remove foreign substance in the plasma chamber. Loading the dummy substrate may include raising a plurality of lift pins from within the substrate support, inserting upper end portions of the plurality of lift pins into a plurality of positioning grooves disposed on a lower surface of the dummy substrate, to align the dummy substrate, and lowering the plurality of lift pins to seat the dummy substrate on the substrate support such that the dummy substrate exposes an inner edge region of a focus ring of the substrate support.

Thus, since the dummy substrate has the second diameter smaller than the first diameter of the substrate to be subjected to the plasma process, an electrostatic chuck of the substrate stage may be protected from plasma. Since the dummy substrate exposes a focus ring of the substrate support to plasma through the second diameter, the foreign substance on the focus ring may be removed, and an arcing phenomenon may be prevented.

Also, since a size of the dummy substrate is relatively small, misalignment may occur during loading of the dummy substrate on the substrate support. When the dummy substrate is loaded, upper end portions of lift pins may be inserted into positioning grooves of the dummy substrate, and the misalignment may be prevented. The dummy substrate may be disposed at a predetermined location, and damage to the electrostatic chuck may be prevented.

BRIEF DESCRIPTION OF DRAWINGS

The above and other aspects, features, and advantages of certain embodiments of the present disclosure will be more apparent from the following description taken in conjunction with the accompanying drawings, in which:

FIG. 3 is a cross-sectional view illustrating a process in which a dry etching process is performed on a semiconductor substrate in the plasma processing apparatus in FIG. 2, according to an embodiment:

FIG. 5 is a cross-sectional view illustrating a process in which a plasma dry cleaning process using a dummy substrate is performed in the plasma processing apparatus in FIG. 2, according to an embodiment:

DETAILED DESCRIPTION

Figure 1:
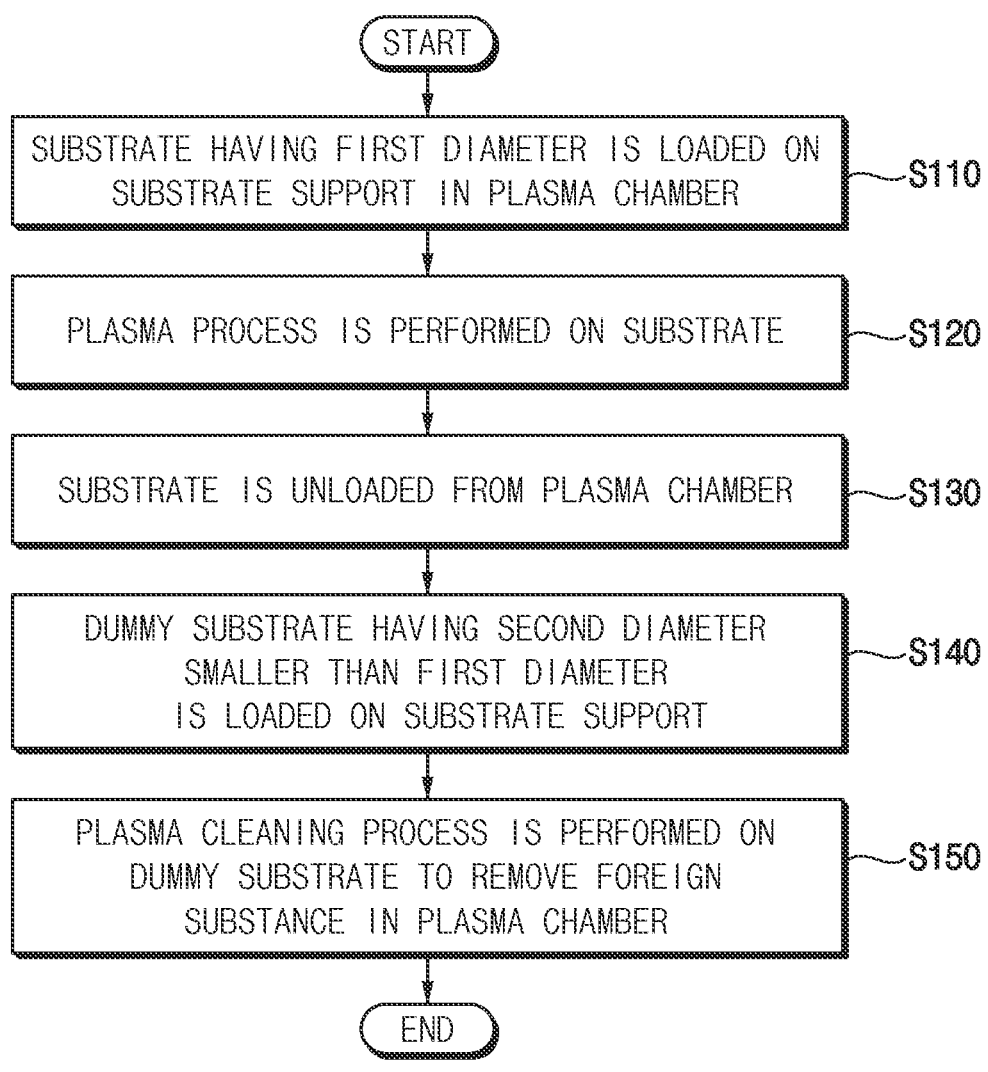
FIG. 1 is a flowchart illustrating a method of manufacturing a semiconductor device, according to an embodiment.

The embodiments herein and the various features and advantageous details thereof are explained more fully with reference to the non-limiting embodiments that are illustrated in the accompanying drawings and detailed in the following description, where similar reference characters denote corresponding features consistently throughout. Descriptions of well-known components and processing techniques are omitted so as to not unnecessarily obscure the embodiments herein. Also, the various embodiments described herein are not necessarily mutually exclusive, as some embodiments may be combined with one or more other embodiments to form new embodiments. The examples used herein are intended merely to facilitate an understanding of ways in which the embodiments herein may be practiced and to further enable those skilled in the art to practice the embodiments herein. Accordingly, the examples should not be construed as limiting the scope of the embodiments herein.

Figure 2:
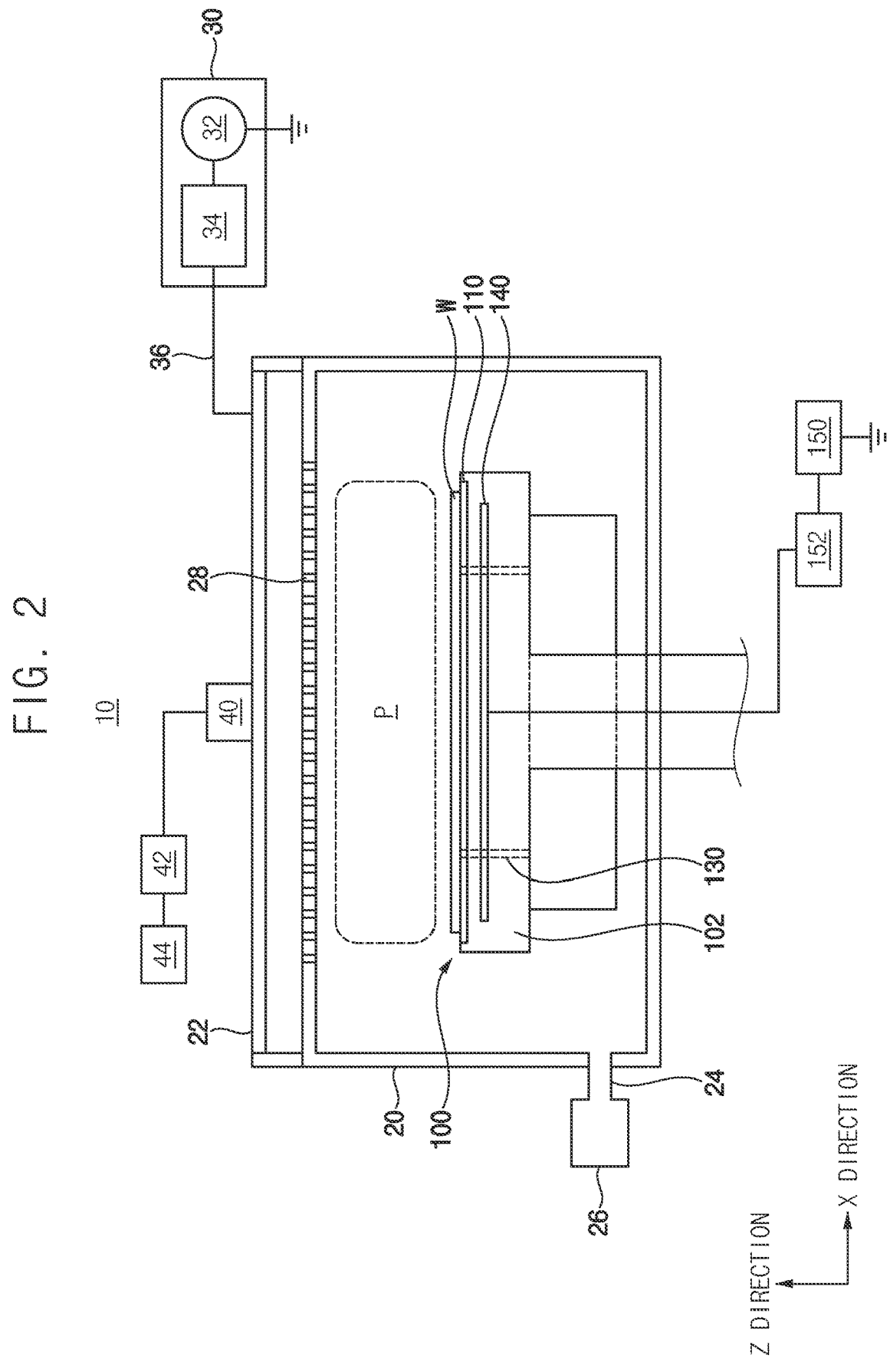
FIG. 2 is a cross-sectional view illustrating a plasma processing apparatus for performing the method in FIG. 1, according to an embodiment.
Figure 4:
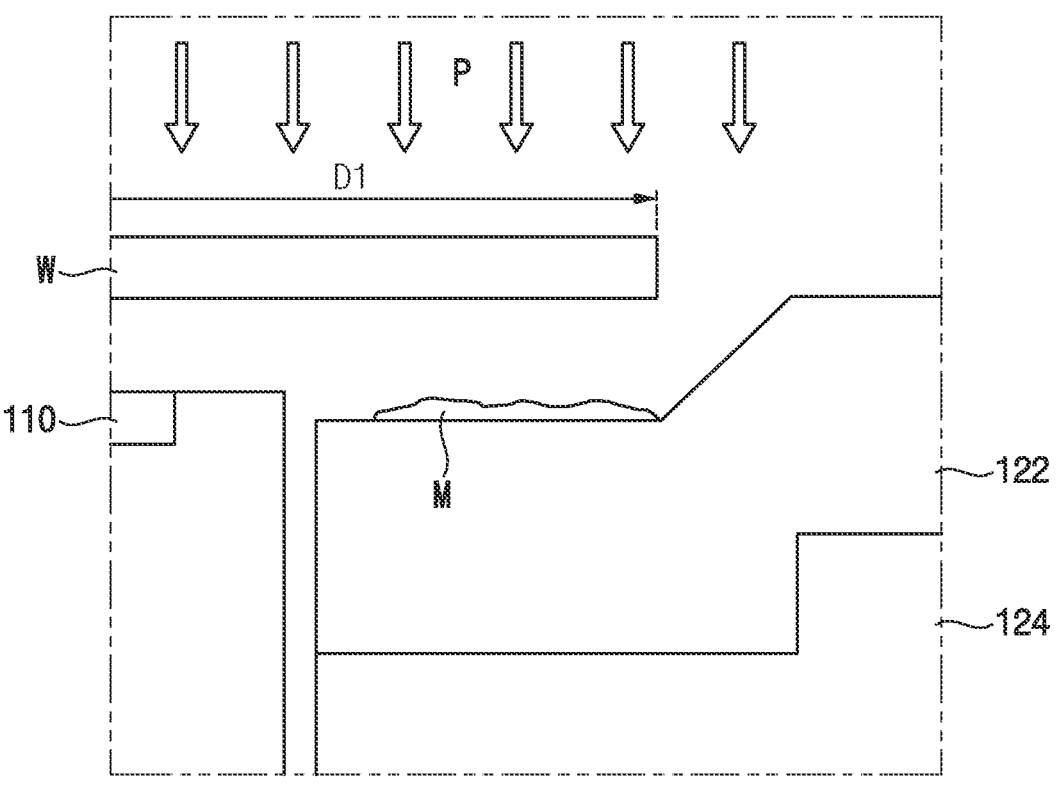
FIG. 4 is an enlarged cross-sectional view illustrating portion 'A' in FIG. 3, according to an embodiment.
Figure 4:
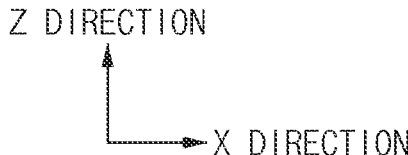

FIG. 1 is a flowchart illustrating a method of manufacturing a semiconductor device, according to an embodiment. FIG. 2 is a cross-sectional view illustrating a plasma processing apparatus for performing the method in FIG. 1, according to an embodiment. FIG. 3 is a cross-sectional view illustrating a process in which a dry etching process is performed on a semiconductor substrate in the plasma processing apparatus in FIG. 2, according to an embodiment. FIG. 4 is an enlarged cross-sectional view illustrating portion 'A' in FIG. 3, according to an embodiment.

Referring to FIGS. 1-4, at S110, the method includes loading a substrate having a first diameter on a substrate support in a plasma chamber. For example, as shown in FIG. 2, a substrate W having a first diameter D1 may be loaded on a substrate stage 100 in a plasma chamber 20. At S120, the method includes performing a plasma process on the substrate. For example, a plasma process may be performed on the substrate W. At S130, the method includes unloading the substrate from the plasma chamber. For example, the substrate W may be unloaded from the plasma chamber 20.

In an embodiment, a method of manufacturing a semiconductor device may include a plasma dry etching process that is performed on the substrate W such as a wafer. The plasma dry etching process may be performed using a plasma processing apparatus 10. As will be described later, the method of manufacturing the semiconductor device may further include an in-situ dry cleaning process that is performed after the plasma dry etching process is performed.

As illustrated in FIG. 2, the plasma processing apparatus 10 may include the chamber 20 providing a space for performing the plasma process on the substrate W, the substrate stage 100 having a seating surface for supporting the substrate W, and a dummy substrate 200 capable of protecting the substrate stage 100. The plasma processing apparatus 10 may further include an upper electrode 22, a source power circuit 30, and the like.

The plasma processing apparatus 10 may be referred to as a device capable of etching a target film on the substrate W such as a semiconductor wafer that is disposed in the chamber 20 for the plasma dry etching process. The plasma processing apparatus 10 is not necessarily limited to an etching device, and may be used as, for example, a deposition device, a cleaning device, and the like. The substrate may include a semiconductor substrate, a glass substrate, and the like.

The plasma processing apparatus 10 may include a capacitively coupled plasma (CCP) processing device. However, plasma generated through the plasma processing apparatus is not limited to capacitive coupled plasma, and may include inductively coupled plasma and microwave plasma.

The plasma dry etching process may be referred to as a chemical process in which electromagnetic energy is applied to at least one precursor gas or precursor vapor to convert a precursor into reactive plasma. The plasma dry etching process may be used to etch materials on semiconductor devices such as the semiconductor wafer W.

In an embodiment, the chamber 20 may provide an enclosed space for performing the plasma dry etching process on the wafer W. The chamber 20 may include a cylindrical vacuum chamber. The chamber 20 may include a metal such as aluminum or stainless steel. For example, the chamber 20 may be referred to as a plasma processing chamber having a tuning electrode inside the substrate stage 100 for enhanced processing rate and plasma profile uniformity.

A gate may be provided on a sidewall of the chamber 20 to allow entry and exit of the wafer W. The wafer W may be loaded onto and unloaded from the substrate stage through the gate.

An exhaust port 24 may be provided in a lower portion of the chamber 20, and an exhaust portion 26 may be connected to the exhaust port 24 through an exhaust pipe. The exhaust portion 26 may include a vacuum pump such as a turbo molecular pump to adjust a processing space inside the chamber 20 to a desired vacuum level. The exhaust portion 26 may maintain a constant pressure inside the chamber 20. In addition, foreign substance and residual process gases generated in the chamber 20 may be discharged through the exhaust port 24.

The upper electrode 22 may be disposed on an outer upper portion of the chamber 20 to face a substrate electrode 140 provided on the substrate stage 100. A chamber space between the upper electrode 22 and the substrate electrode 140 may be used as a plasma generating region. The upper electrode 22 may have a surface that faces the wafer W on the substrate stage 100.

The upper electrode 22 may be supported by an insulating shield member above the chamber 20. The upper electrode 22 may include a circular electrode plate. The upper electrode 22 may have a plurality of supply holes through which gas is supplied into the chamber 20.

The source power circuit 30 may supply plasma source power to the upper electrode 22. The source power circuit 30 may be connected to the upper electrode 22 through a signal line 36. For example, the source power circuit 30 may include a high frequency generator 32 and a matcher 34 as plasma source elements. The high frequency generator 32 may generate a high frequency (RF) signal. The matcher 34 may match an output impedance of the RF signal that is generated through the high frequency generator 32 to control the plasma P that is generated through the upper electrode 22. The matcher 34 may change an internal capacitor to control the output impedance.

In an embodiment, the plasma processing apparatus 10 may further include a gas supply portion for supplying the gas into the chamber 20. As will be described later, the gas supply portion may provide a cleaning gas capable of removing the foreign substance M inside the chamber 20.

For example, the gas supply portion may include gas supply pipes 40, a flow controller 42, and a gas supply source 44 as gas supply elements. The gas supply pipes 40 may supply various gases to top and/or side of the chamber 20. The gas supplied from the gas supply pipes 40 may be injected into the chamber 20 through a shower head 28. The shower head 28 may directly spray the various gases into the plasma space P in the chamber 20.

The gas supply portion may supply different gases at a desired ratio. The gas supply source 44 may store a plurality of gases, and the gases may be supplied through a plurality of gas lines respectively connected to the gas supply pipes 40. The flow controller 42 may control supply flow rates of the gases introduced into the chamber 20 through the gas supply pipes 40. The flow controller 42 may control the supply flow rates of the shower head 28. For example, the gas supply source 44 may include a plurality of gas tanks, and the flow controller 42 may include a plurality of mass flow controllers (MFCs) respectively corresponding to the gas tanks. The mass flow controllers may independently control the supply flow rates of the gases.

As illustrated in FIG. 3, In an embodiment, the substrate stage 100 may include a substrate support 102 having an electrostatic chuck 110 that is configured to adsorb and to fix the wafer W in the chamber 20, a ring assembly 120 configured to control the plasma P in an edge region of the wafer W, and a lift pin assembly having a plurality of lift pins 130 capable of stably positioning the wafer W on the electrostatic chuck 110. As will be described later, the ring assembly 120 may include an outer insulating ring 124 disposed around the substrate support 102, and a focus ring 122 covering the edge region of the wafer W on the outer insulating ring 124.

For example, the substrate stage 100 may serve as a susceptor for supporting the wafer W. The substrate stage 100 may form a conductor such as a radio frequency (RF) electrode, a clamping electrode, or a resistance heating element on an inside or a surface. The substrate stage 100 may serve as a heater.

In an embodiment, the substrate support 102 may include the electrostatic chuck 110 capable of holding the wafer W on an upper side through electrostatic adsorption force, and the substrate electrode 140 configured to control the plasma P in the chamber 20. The substrate support 102 may have a seating surface 104 for contacting and supporting the wafer W.

The substrate support 102 may include metallic or ceramic materials. For example, the metallic or the ceramic materials may include at least one of metals, metal oxides, metal nitrides, metal oxynitrides, or any combination thereof. The substrate support 102 may include aluminum, aluminum oxide, aluminum nitride, aluminum oxynitride, or any combination thereof.

In an embodiment, the electrostatic chuck 110 may adsorb and hold the wafer W using electrostatic force that is generated from DC voltage supplied from a DC power supply. The electrostatic chuck 110 may provide the seating surface for directly contacting and supporting the wafer W. Alternatively, the electrostatic chuck 110 may be embedded in the substrate support 102 to support the wafer W. For example, the electrostatic chuck 110 may be connected to a power circuit 150 to receive the electrostatic force. Alternatively, the electrostatic chuck 110 may receive the electrostatic force from a separated DC power source.

For example, after the wafer W is placed on the electrostatic chuck 110, a predetermined voltage may be applied from the DC power supply. When the predetermined voltage is applied, a potential difference may be occurred between the wafer W and the electrostatic chuck 110 by the high DC voltage. The potential difference may cause a dielectric polarization phenomenon inside an insulator of the electrostatic chuck. The electrostatic force may be generated by the dielectric polarization phenomenon, and the electrostatic chuck 110 may clamp the wafer W through the electrostatic force.

When the plasma dry etching process is completed, the electrostatic chuck 110 may remove the electrostatic force for de-chucking the wafer W. After the plasma dry etching process is completed, the DC power source may block the voltage provided to the electrostatic chuck 110.

The substrate electrode 140 may be disposed under the wafer W. In addition, the substrate electrode 140 may have a circulation channel for cooling therein. Also, for precision of wafer temperature, a cooling gas such as He gas may be supplied between the electrostatic chuck 110 and the wafer W. The substrate electrode 140 may cool the wafer W in contact with the high temperature plasma.

The power circuit 150 may supply bias power to the substrate electrode 140. The power circuit 150 may include a bias RF power supply and the bias RF matcher as bias elements. The substrate electrode 140 may attract plasma atoms or ions generated in the chamber 20 through the power circuit 150.

The capacitor variable portion 152 may vary a capacitor of the substrate electrode 140. For example, the capacitor variable portion 152 may be connected to the substrate electrode 140 through a signal line 154. The capacitor variable portion 152 may include an electronic tuner and an electronic sensor that have variable capacitors. The electronic sensor may be a voltage sensor or a current sensor, and may be connected to the electronic tuner to control the plasma in the chamber 20.

In an embodiment, the ring assembly 120 may include the outer insulating ring 124 disposed around an outer circumference of the substrate support 102, and a focus ring 122 covering the edge region of the wafer W on the outer insulating ring 124. The ring assembly 120 may remove process variables of a periphery of the wafer W when the plasma process is performed. The ring assembly 120 may maintain a constant temperature of the substrate stage 100. The ring assembly 120 may be detachably provided on the substrate support 102. When the ring assembly 120 is continuously exposed to the plasma P and durability of the ring assembly 120 is reduced, the ring assembly 120 may be replaced.

In an embodiment, the outer insulating ring 124 may be disposed to cover an upper outer circumference of the substrate support 102. The outer insulating ring 124 may serve as a cover ring capable of protecting an outer surface of the substrate support 102. For example, the outer insulating ring 124 may include a ceramic material such as alumina ($Al_2O_3$), silicon carbide (SiC), or yttria ($Y_2O_3$).

The focus ring 122 may have an annular shape. The focus ring 122 may include a body of the annular shape, and an inner end portion extending around an inner circumference of the body and having an inclined upper surface. In addition, the focus ring 122 may further include an outer end portion extending around an outer circumference of the body. The body may have an annular bottom surface and an annular upper surface. The annular bottom surface of the body may be contacted and supported on the outer insulating ring 124.

As illustrated in FIG. 4, the foreign substance M may remain on the focus ring 122 in the plasma dry etching process. For example, the wafer W may be provided on the substrate stage 100, the wafer W may block an inner edge region of the focus ring 122, and the plasma P may be blocked by the wafer to reach the inner edge region of the focus ring 122. Thus, the non-ionized foreign substance M may remain on the inner edge region of the focus ring 122, and it is necessary to remove the foreign substance M in the in-situ dry cleaning process.

Hereinafter, a plasma dry cleaning process for removing foreign substance will be described.

Figure 6:
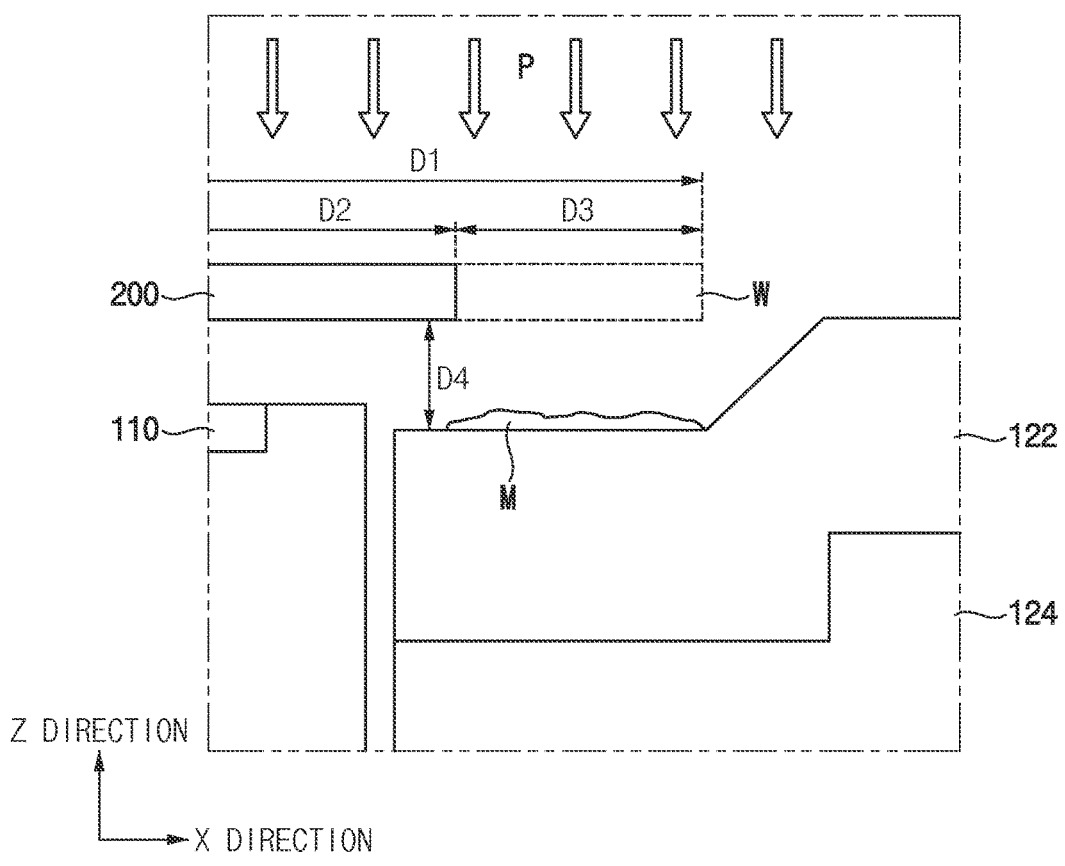
FIG. 6 is an enlarged cross-sectional view illustrating portion 'B' in FIG. 5, according to an embodiment.
Figure 7:
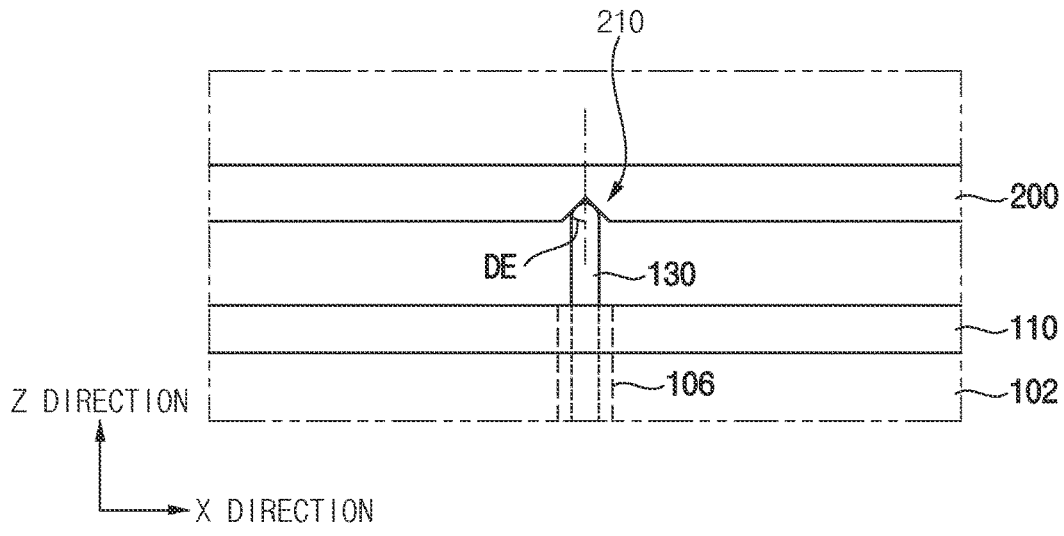
FIG. 7 is an enlarged cross-sectional view illustrating portion 'C' in FIG. 5, according to an embodiment.

FIG. 5 is a cross-sectional view illustrating a process in which a plasma dry cleaning process using a dummy substrate is performed in the plasma processing apparatus in FIG. 2, according to an embodiment. FIG. 6 is an enlarged cross-sectional view illustrating portion 'B' in FIG. 5, according to an embodiment. FIG. 7 is an enlarged cross-sectional view illustrating portion 'C' in FIG. 5, according to an embodiment.

Referring to FIG. 1-7, at S140, the method includes loading a dummy substrate having a second diameter smaller than the first diameter on the substrate support. For example, as shown in FIG. 5, the dummy substrate 200 having a second diameter D2 smaller than the first diameter D1 of the substrate W may be loaded on the substrate support 102. At S150, the method includes performing a plasma cleaning process on the dummy substrate to remove foreign substance in the plasma chamber. For example, a plasma dry cleaning process may be performed on the dummy substrate 200 to remove the foreign substance in the plasma chamber 20.

In an embodiment, the plasma dry cleaning process may be performed to remove the foreign substance in the plasma processing apparatus 10. For example, after the plasma dry etching process is performed for a predetermined number of times inside the plasma processing apparatus 10, the plasma dry cleaning process may be performed for once. For example, the predetermined number of times may be within a range of 1 time to 100 times.

The plasma dry cleaning process may be referred to as an in-situ dry cleaning (ISD) process in which water is dissolved in-situ after the plasma etching process is performed. The plasma dry cleaning process may be referred to as a process for removing the foreign substance (polymer) remained on the substrate stage 100 after the plasma dry etching process of the wafer W adsorbed on the substrate stage 100 is completed. After the plasma dry etching process of the wafer W is completed, the plasma dry cleaning process may remove the foreign substance M on the substrate stage 100 using the dummy substrate 200. The plasma dry cleaning process may prevent an arcing phenomenon of the introduced wafer W in the process of the plasma dry etching process.

When the plasma dry cleaning process is performed, the cleaning gas may be supplied inside the chamber 20 from the gas supply portion. For example, the cleaning gas may include boron chlorine compound ($BCl_x$), silicon chlorine compound ($SiCl_x$), sulfur hexafluoride ($SF_6$), nitrogen trifluoride ($NF_3$), chlorine ($Cl_2$), silicon tetrabromide ($SiBr_4$), hexafluoride butadiene ($C_4F_6$), octafluorocyclobutane ($C_4F_8$), carbon pentafluoride ($CF_5$), fluoroform ($CHF_3$), and the like.

In an embodiment, the dummy substrate 200 may be provided at a predetermined position on the substrate stage 100 to protect the electrostatic chuck 110 when plasma P is generated. The dummy substrate 200 may be referred to as a semiconductor device to be subjected to the plasma dry etching process. Alternatively, the dummy substrate 200 may be introduced into the chamber 20 and protect the electrostatic chuck 110 only when the plasma dry cleaning process is performed. The dummy substrate 200 may be loaded on or unloaded from the substrate stage 100 through the gate in a same manner as the wafer W.

As illustrated in FIGS. 5 and 6, the dummy substrate 200 may have the small second diameter D2 smaller than the first diameter D1 of the wafer W such that the foreign substance M on the focus ring 122 is exposed to the plasma P. Since the second diameter D2 of the dummy substrate 200 is smaller than the first diameter D1 of the wafer W, when the plasma dry cleaning process is performed, the foreign substance M accumulated on the focus ring 122 may be exposed to plasma P that is generated in the plasma dry cleaning process.

When the dummy substrate 200 is provided at the predetermined position on the substrate stage 100, that is, when the dummy substrate 200 is aligned, the dummy substrate

200 may expose the focus ring 122 to the plasma P while covering the electrostatic chuck 110 of the substrate stage 100.

For example, the second diameter D2 of the dummy substrate 200 may be within a range of 250 mm to 350 mm. A difference D3 between the first diameter D1 of the wafer W and the second diameter D2 of the dummy substrate 200 may be within a range of 0.5 mm to 2 mm.

The dummy substrate 200 may include a plurality of positioning grooves 210 capable of aligning the dummy substrate 200 to the predetermined position. The plurality of positioning grooves 210 may accommodate end portions of the lift pins 130, respectively.

The positioning grooves 210 may have a tapered shape in which a surface area gradually increases with a predetermined angle DE such that the lift pins 130 are easily accommodated. The tapered shape may include a shape in which a diameter decreases as a depth from a lower surface of the dummy substrate 200 increases. For example, the predetermined angle DE may be within a range of 40 degrees to 80 degrees.

In an embodiment, when the dummy substrate 200 is loaded on the substrate support 102 (S140), the plurality of lift pins 130 may be raised from within the substrate support 102, the dummy substrate 200 may be placed on the raised lift pins 130, and the lift pins 130 are lowered such that the dummy substrate 200 is seated on the substrate support 102.

In an embodiment, the dummy substrate 200 may be loaded on the substrate support 102 through the lift pin assembly installed in an accommodating space CI of the substrate support 102. The lift pin assembly may include first actuators configured to move the lift pins 130 for raising or lowering the dummy substrate 200, second actuators configured to move the lift pins 130 for raising or lowering the wafer W, and the like.

The lift pin assembly may include the lift pins 130, a connection pin 132 and a drive pin 134. In addition, the lift pin assembly may further include a drive plate 136 and a bellows 138. The lift pin assembly may be provided under the substrate support 102 or inside the substrate support 102.

The lift pin assembly may be mounted in a mounting hole of the substrate stage 100. The mounting hole may include pin holes 106 of the substrate support 102. The lift pin 130 may be installed to be movable in a vertical direction within the pin hole 106. The upper end portion of the lift pin 130 may protrude through the pin hole 106 that is opened from the seating surface 104 to contact and to support the lower surface of the dummy substrate 200.

The lift pins 130 may stably position the wafer W and the dummy substrate 200 on the seating surface 104 of the substrate support 102. The lift pins 130 may penetrate the electrostatic chuck 110, and may support the lower surface of the wafer W. The lift pins 130 may move in the vertical direction (Z direction) orthogonal to the seating surface 104 within the plurality of pin holes 106 that are provided in the substrate support 102.

For example, the end portions of the lift pins 130 may have a convex shape, and the lift pins may stably support the lower surface of the wafer W through the convex shape.

The lift pins 130 may be symmetrically disposed in a circumferential direction with respect to a center of the substrate stage 100. The number of lift pins 130 may be in the range of 3-6. The lift pins 130 may be provided to be spaced apart from the center of the substrate stage for a predetermined distance. The predetermined distance may be within a range of 60 mm to 90 mm.

A guide hole 108 connecting to the pin hole 106 may be provided below the pin hole 106. The guide hole 108 may extend in a radial direction (X direction) from the center of the substrate support 102. The guide hole 108 may extend in the vertical direction (Z direction) of the substrate support 102. A width of the guide hole 108 in the radial direction may vary according to a length of the connection pin 132. The width of the guide hole 108 in a thickness direction may vary according to a stroke of the lift pin 130. Thus, the connection pin 132 may be accommodated in the guide hole 108 so as to move up and down.

The drive pins 134 may extend through guide holes 108. The drive pin 134 may extend vertically into the accommodating space C1 under the substrate support 102. One end portion of the drive pin 134 may be fixed to the drive plate 136.

The bellows 138 may be provided to surround the drive pin 134. The bellows 138 may isolate the inner space of the chamber 20 and the receiving space C1 under the substrate support 102 from each other. An upper end portion of the bellows 138 may be fixed to a lower surface of the substrate support 102, and a lower end portion of the bellows 138 may be fixed to the drive plate 136. A sealing member may be mounted in a ring receiving groove provided in the bellows 138. The bellows 138 may be engaged to the substrate support 102 through the sealing member such as an O-ring. Thus, the bellows 138 may seal the inner space of the chamber 20 from outside when the drive pin 134 freely moves up and down.

Since the connection pins 132 are disposed to extend radially from the center of the substrate support 102, the lift pins 130 may be disposed radially farther from the center of the substrate support 102 than the drive pins 134. A driving mechanism including the actuators for moving the lift pin 230 up and down may be disposed inside the accommodating space C1 under the substrate support 102 without leaving the outer surface of the substrate support 102.

In an embodiment, when the dummy substrate 200 is placed on the raised lift pins 130, the upper end portions of the lift pins 130 may be inserted into the positioning grooves 210, respectively, such that the dummy substrate 200 is self-aligned on the substrate stage 100.

As illustrated in FIGS. 6 and 7, when the plasma P is generated in the plasma dry cleaning process, the lift pins 130 that are accommodated in the positioning grooves 210 may be raised. For example, when the lift pins 130 are raised, a distance D4 between the dummy substrate 200 and the focus ring 122 may be within a range of 1.5 mm to 2.5 mm.

Since the positioning grooves 210 have the predetermined angle DE, the end portions of the lift pins 130 may be more easily accommodated in the positioning grooves 210, and the dummy substrate 200 may be stably disposed. Thus, the dummy substrate 200 may be self-aligned on the substrate support 102.

For example, when the wafer W is loaded from the gate, the lift pins 130 may protrude from the seating surface 104 of the substrate stage 100 toward the dummy substrate 200 to support the dummy substrate 200. When the dummy substrate 200 is disposed on the lift pins 130, the lift pins 130 may move inside the substrate stage 100 to stably position the dummy substrate 200 on the substrate support 102.

As described above, since the dummy substrate 200 has the second diameter D2 smaller than the first diameter D1 of the substrate W to be subjected to the plasma process, the electrostatic chuck 110 of the substrate stage 100 may be protected from the plasma P. Since the dummy substrate 200 exposes the focus ring 122 to plasma P through the second diameter D2, the foreign substance M on the focus ring 122 may be removed, and an arcing phenomenon may be prevented.

Also, since a size of the dummy substrate 200 is relatively small, misalignment may occur during loading of the dummy substrate 200 on the substrate support 102. When the dummy substrate 200 is loaded, the upper end portions of lift pins 130 may be inserted into the positioning grooves 210 of the dummy substrate 200, and the misalignment may be prevented. The dummy substrate 200 may be disposed at the predetermined location, and damage to the electrostatic chuck 110 may be prevented.

While example embodiments of the disclosure have been shown and described, the disclosure is not limited to the aforementioned specific embodiments, and it is apparent that various modifications can be made by those having ordinary skill in the technical field to which the disclosure belongs, without departing from the gist of the disclosure as claimed by the appended claims and their equivalents. Also, it is intended that such modifications are not to be interpreted independently from the technical idea or prospect of the disclosure.

What is claimed is:

1. A method of manufacturing a semiconductor device, the method comprising:
   arranging a focus ring around an upper outer circumference of a substrate support;
   loading a substrate having a first diameter on the substrate support in a plasma chamber;
   performing a plasma process on the substrate;
   unloading the substrate from the plasma chamber;
   loading a dummy substrate having a second diameter smaller than the first diameter on the substrate support; and
   performing a plasma cleaning process on the dummy substrate to remove foreign substance in the plasma chamber,
   wherein the focus ring has an inner diameter that is less than the second diameter of the dummy substrate.

2. The method of claim 1, wherein the loading the dummy substrate comprises:
   raising a plurality of lift pins from within the substrate support;
   placing the dummy substrate on the raised plurality of lift pins; and
   lowering the plurality of lift pins such that the dummy substrate is seated on the substrate support.

3. The method of claim 2, wherein the placing the dummy substrate on the raised plurality of lift pins comprises:
   positioning upper end portions of the plurality of lift pins so as to be inserted into a plurality of positioning grooves in a lower surface of the dummy substrate, respectively, to self-align the dummy substrate.

4. The method of claim 3, wherein each of the plurality of positioning grooves has a tapered shape in which a surface area gradually increases with a predetermined angle for insertion of the upper end portions of the plurality of lift pins.

5. The method of claim 1, wherein the loading the dummy substrate comprises:
   exposing an inner edge region of the focus ring based on the dummy substrate being placed on the substrate support.

6. The method of claim 1, wherein the performing the plasma cleaning process on the dummy substrate comprises:

introducing a cleaning gas into the plasma chamber; and generating plasma.

7. The method of claim 6, wherein the cleaning gas comprises at least one of boron chlorine compound ($BCl_x$), silicon chlorine compound ($SiCl_x$), sulfur hexafluoride ($SF_6$), nitrogen trifluoride ($NF_3$), chlorine ($Cl_2$), silicon tetrabromide ($SiBr_4$), butadiene hexafluoride ($C_4F_6$), octafluorocyclobutane ($C_4F_8$), carbon pentafluoride ($CF_5$), and fluoroform ($CHF_3$).

8. The method of claim 1, wherein a difference between the first diameter of the substrate and the second diameter of the dummy substrate is within a range of 0.5 mm to 2 mm.

9. The method of claim 1, wherein the second diameter of the dummy substrate is within a range of 250 mm to 350 mm.

10. A method of manufacturing a semiconductor device, the method comprising:

arranging a focus ring around an upper outer circumference of a substrate support;

loading a substrate having a first diameter on the substrate support in a plasma chamber;

performing a plasma dry etching process on the substrate;

unloading the substrate from the plasma chamber;

loading a dummy substrate having a second diameter smaller than the first diameter on the substrate support using a plurality of lift pins; and performing a plasma dry cleaning process on the dummy substrate to remove foreign substance in the plasma chamber, wherein the focus ring has an inner diameter that is less than the second diameter of the dummy substrate.

11. The method of claim 10, wherein the loading the dummy substrate comprises:

raising the plurality of lift pins from within the substrate support;

placing the dummy substrate on the raised plurality of lift pins; and lowering the plurality of lift pins such that the dummy substrate is seated on the substrate support.

12. The method of claim 11, wherein the placing the dummy substrate on the raised plurality of lift pins comprises:

positioning upper end portions of the plurality of lift pins so as to be inserted into a plurality of positioning grooves in a lower surface of the dummy substrate, respectively, to self-align the dummy substrate.

13. The method of claim 12, wherein each of the plurality of positioning grooves has a tapered shape in which a surface area gradually increases with a predetermined angle for insertion of the upper end portions of the plurality of lift pins.

14. The method of claim 10, wherein the loading the dummy substrate comprises:

exposing an inner edge region of the focus ring based on the dummy substrate being placed on the substrate support.

15. The method of claim 10, wherein the performing the plasma dry cleaning process on the dummy substrate comprises:

introducing a cleaning gas into the plasma chamber; and generating plasma.

16. The method of claim 15, wherein the cleaning gas comprises at least one of boron chlorine compound ($BCl_x$), silicon chlorine compound ($SiCl_x$), sulfur hexafluoride ($SF_6$), nitrogen trifluoride ($NF_3$), chlorine ($Cl_2$), silicon tetrabromide ($SiBr_4$), butadiene hexafluoride ($C_4F_6$), octafluorocyclobutane ($C_4F_8$), carbon pentafluoride ($CF_5$), and fluoroform ($CHF_3$).

17. The method of claim 10, wherein a difference between the first diameter of the substrate and the second diameter of the dummy substrate is within a range of 0.5 mm to 2 mm.

18. A method of manufacturing a semiconductor device, the method comprising:

arranging a focus ring around an upper outer circumference of a substrate support;

loading a substrate having a first diameter on a on the substrate support in a plasma chamber;

performing a plasma dry etching process on the substrate;

unloading the substrate from the plasma chamber;

loading a dummy substrate having a second diameter smaller than the first diameter on the substrate support; and performing a plasma dry cleaning process on the dummy substrate to remove foreign substance in the plasma chamber, wherein loading the dummy substrate comprises raising a plurality of lift pins from within the substrate support, inserting upper end portions of the plurality of lift pins into a plurality of positioning grooves disposed on a lower surface of the dummy substrate, to align the dummy substrate, and lowering the plurality of lift pins to seat the dummy substrate on the substrate support such that the dummy substrate exposes an inner edge region of the focus ring, and wherein the focus ring has an inner diameter that is less than the second diameter of the dummy substrate.

* * * * *